United States Patent [19]
Bernstein

[11] Patent Number: 4,742,487
[45] Date of Patent: May 3, 1988

[54] INHIBIT AND TRANSFER CIRCUITRY FOR MEMORY CELL BEING READ FROM MULTIPLE PORTS

[75] Inventor: Kerry Bernstein, Underhill, Vt.

[73] Assignee: International Business Machines Corporation, Armonk, N.Y.

[21] Appl. No.: 852,465

[22] Filed: Apr. 15, 1986

[51] Int. Cl.[4] .............................................. G11C 7/00
[52] U.S. Cl. .................................. 365/189; 365/195; 365/203
[58] Field of Search ............... 365/189, 230, 190, 205, 365/203, 195

[56] References Cited

U.S. PATENT DOCUMENTS

| | | | |
|---|---|---|---|
| 4,535,428 | 8/1985 | Furman | 365/189 |
| 4,577,292 | 3/1986 | Bernstein | 365/189 |
| 4,598,387 | 7/1986 | Chuang et al. | 365/205 |
| 4,616,342 | 10/1986 | Miyamoto | 365/205 |
| 4,616,347 | 10/1986 | Bernstein | 365/230 |

*Primary Examiner*—James W. Moffitt
*Attorney, Agent, or Firm*—Sughrue, Mion, Zinn, Macpeak, and Seas

[57] ABSTRACT

An inhibit and transfer circuit for a memory system having multiple read ports. Bit lines are precharged. In a reading operation, the precharging is disconnected at the same time that the bit lines are selectively connected to one or more sense latches, associated with multiple reading ports. Feedback paths in the sense latches are disconnected during the reading. The selection of the sense latches to which the bit lines are coupled is determined by a comparison of multiple addressing signals.

8 Claims, 2 Drawing Sheets

INHIBIT AND TRANSFER CIRCUITRY FOR MEMORY CELL BEING READ FROM MULTIPLE PORTS

BACKGROUND OF THE INVENTION

1. Field of the Invention

The invention relates generally to random access memories. In particular, the invention relates to a random access memory, any location of which can be simultaneously read by a multiplicity of ports.

2. Background Art

There exists a need in some microprocessor applications to have high speed registers in which each register can be separately addressable from a multiplicity of data-in ports for a write and separately addressable from a multiplicity of data-out ports for a read. The use of multi-port memories is old in the art. In such a multi-port memory, allowance must be made for the fact that the same memory location may be simultaneously accessed by more than one of the data-out or read ports. That is, in a given read cycle, the same memory cell may be required to control the output circuitry for more than one port. Bit lines are typically precharged before reading. In this situation, the memory cell must obviously have the current sinking capability for simultaneously transferring its data signal by discharging more than one output port. This problem is generically known as fan-out. Conceptually, increased fan-out can be accommodated by increasing the size of the output transistors in the individual memory cells so that they can discharge multiple bit lines. The primary difficulty with this approach of increasing the size of the discharge transistors is that the transistors need to be associated with each of the memory cells and the size of the transistors increase with their current discharging capability. As a result, the resultant memory chip may become excessively large. Furthermore, response times are increased at the same time that the current sinking levels are increased. Hence, the memory is both unacceptably large and too slow. Bernstein and Furman in a series of patent applications, Ser. No. 474,071, filed Mar. 10, 1983 (U.S. Pat. No. 4,535,428, issued Aug. 13, 1985), Ser. No. 499,729, filed May 31, 1983 (U.S. Pat. No. 4,577,292; issued Mar. 18, 1986) and Ser. No. 499,730, filed May 31, 1983 now U.S. Pat. No. 4,616,347 issued Oct. 7, 1986 have described an alternative approach. The concept is presented schematically in FIG. 1 for a plurality of individual memory cells 12, of which only three are shown in the figure. Furthermore, the figure does not show the parallel nature of a register memory in which multiple cells are accessed in parallel to provide a multi-word. Finally, FIG. 1 does not show the circuitry associated with the writing of the memory cells 12 but is concerned only with the reading of the cells. The illustrated memory system has three read ports that read respective memory cells 12 as indicated by respective addresses P1, P2 and P3. Address decoders 14, 16 and 18 receive the address signals P1, P2 and P3 and, after decoding the addresses, activate respective word lines 20 for coupling the contents of the selected memory cells 12 to bit lines 22. In a three-port system, there would be 3 bit lines 22, each generally corresponding to a particular port. The address P1 would be the address of the memory cell 12 to be coupled to the first port. Similarly P2 is associated with the second port and P3 with the third port.

The problem arises when two or more of the addresses P1, P2 and P3 are equal so that one of the memory cells 12 is expected to discharge two or more of the bit lines 22. A better solution than increasing the size of the discharge transistors in the memory cells 12 is to instead compare the three addresses P1, P2 and P3 in comparators 24, 26 and 28. If the two addresses P1 and P2 are equal, then the decoder 16 for the second address P2 is disabled. Similarly, if the addresses P1 and P3 are equal or if the addresses P2 and P3 are equal, then the decoder 18 for the third address P3 is disabled. As a result, a particular memory cell 12 is selected by only one of the decoders 14, 16 and 18 regardless of the equality of the addresses P1, P2 and P3. Furthermore, if the addresses are ordered in a rising sequence from P1 to P3, then the lower order bit lines 12 are favored.

The task then remains in the case in which some of the addresses are equal to inhibit the respective port from reading what is normally its associated line but instead to transfer the data from one bit line 22 to another port. This function is performed by the inhibit and transfer circuits 30, 32 and 34. For instance, if P1=P2=P3, then both of the decoders 16 and 18 would be disabled and the selected memory cell 12 would be read only from a single bit line 22. However, the single bit line would then be coupled to all 3 read ports through the three inhibit and transfer circuits 30, 32 and 34. The advantage of this approach is that at no time does any memory cell 12 need to discharge more than one bit line.

The transfer and inhibit circuits described in the above three patent applications are disadvantageous for a number of reasons. They tend to separate the two functions of inhibiting and transferring into two separate circuits. As a result, the circuits are excessively complex. Furthermore, in all three applications, differential bit lines are being used. In the read state, one of the differential bit lines is high while the other is low. It is preferred that the number of lines be reduced by using single ended reads from the memory cell. In this case, it is further advantageous to precharge the bit lines so that they can be selectively discharged by the memory cell to which they are connected. None of the applications discloses how the bit lines would be precharged.

SUMMARY OF THE INVENTION

Accordingly, an object of the invention is to provide an inhibit and transfer circuit for a multi-read port memory system.

Another object of the invention is to provide an inhibit and transfer circuit that also precharges the bit lines.

The invention can be summarized as a inhibit and transfer circuit in which, before a sense clock signal becomes active, the bit lines are connected to a precharging potential. When the sense clock goes active, the precharging is disconnected and a feedback path of an output latch is opened. Then, a selected memory cell selectively discharges the one bit line to which it is connected. This bit line is coupled to one or more output latches depending upon a comparison of multiple addresses for multiple reads. The memory cell signal determines the state of each of the output latches to which it is connected. At the termination of the sense clock signal, the bit lines are disconnected from the output latches and the feedback path is reconnected so that the signal is latched on the output.

DETAILED DESCRIPTION OF THE PREFERRED EMBODIMENT

Figure 1:
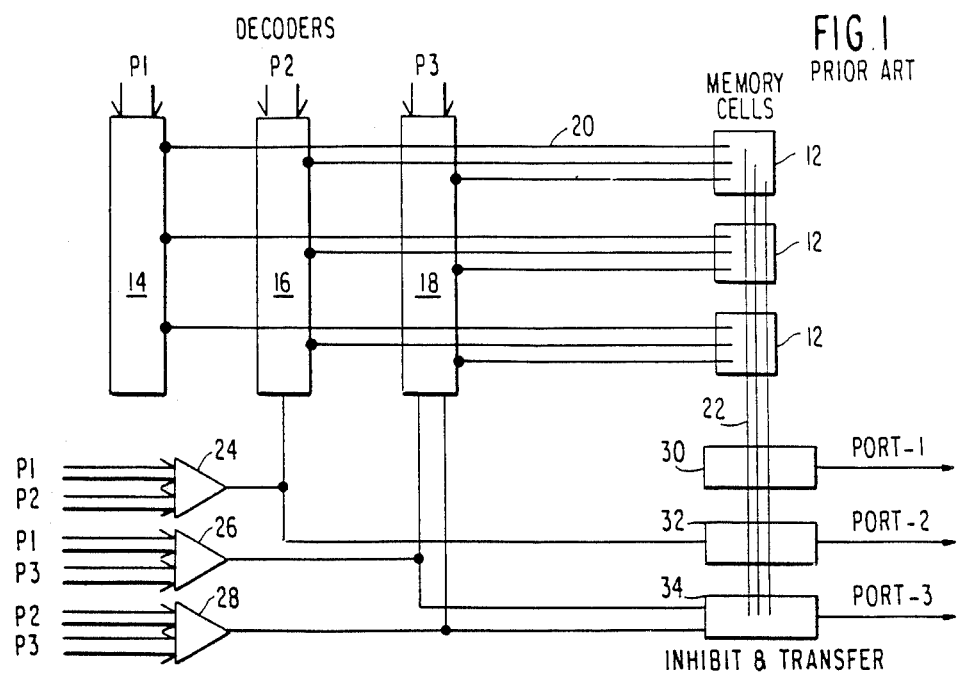
FIG. 1 is a block diagram of a prior art memory system using multiple read ports but in which a memory cell is read to only one bit line.
Figure 2:
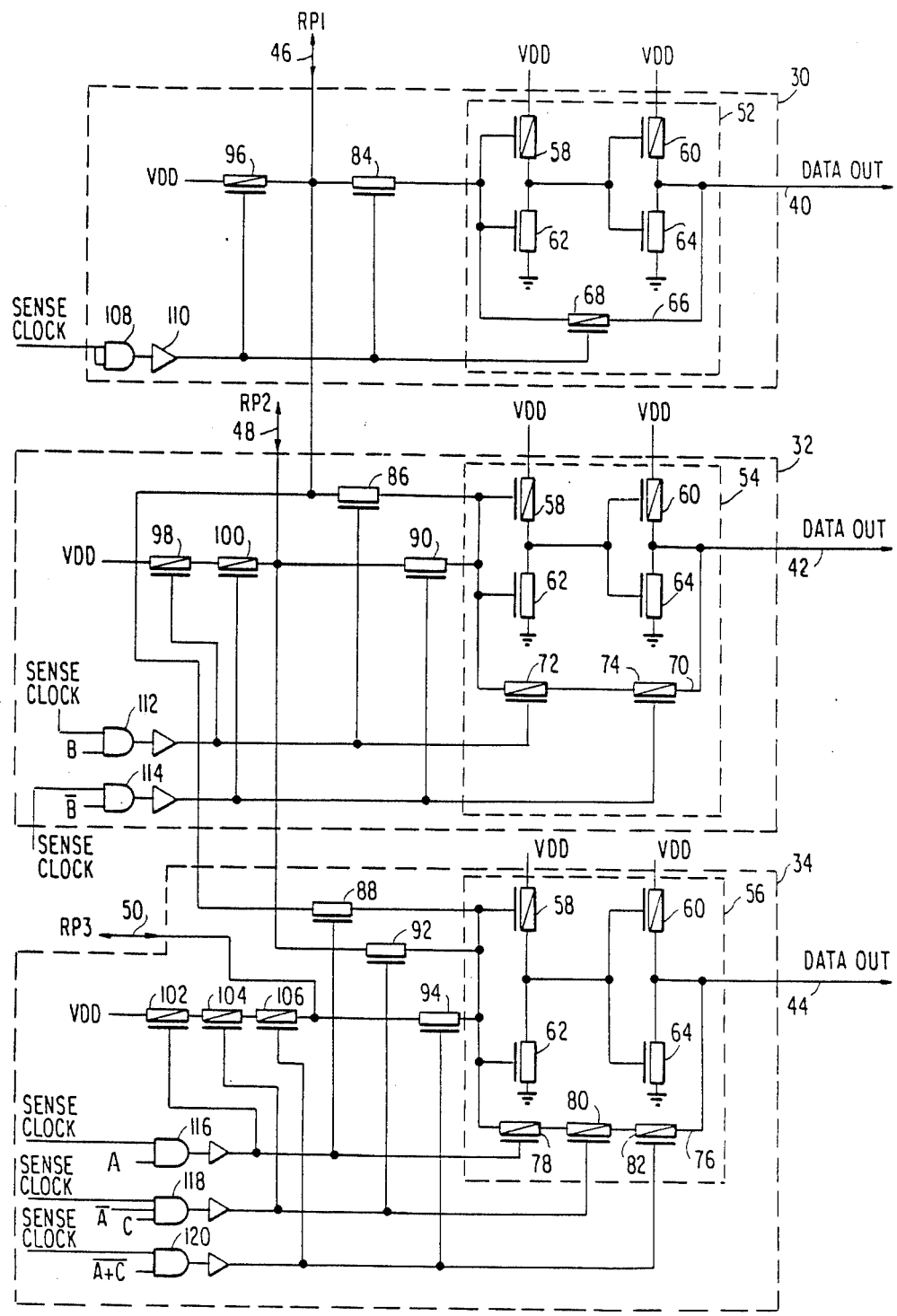
FIG. 2 is a schematic diagram of the inhibit and transfer circuit of the present invention.

The present invention is an improved inhibit and transfer circuit, illustrated in the circuit diagram of FIG. 2, that also provides for precharging of the bit lines. There are three distinguishable inhibit and transfer circuits 30, 32 and 34 associated with data output lines 40, 42 and 44 for the three read ports. There are three bit lines 46, 48 and 50, together corresponding to the bit lines 22 of FIG. 1. In the absence of the addresses P1, P2 and P3 being equal, there is no inhibition and the first bit line 46 provides data to the first data output line 40, the second bit line 48 provides data to the second data output line 42 and the third bit line 50 provides data for the third data output line 44. If, however, some of the addresses are equal, then data must be transferred from one of the lower order bit lines 46 and 48 to higher order data output lines 42 and 44 with an accompanying inhibition of the data transfer between the normally associated bit lines and data output lines. Each of the inhibit and transfer circuits 30, 32 and 34 has a CMOS latch 52, 54 and 56, each consisting of two PMOS transistors 58 and 60 and two NMOS transistors 62 and 64. These transistors 58, 60, 62, and 64 are cross-connected in the usual fashion for a CMOS latch except that one of the feedback paths is interruptable by one or more PMOS transistors. A feedback path 66 in the latch 52 for the first read port has a single PMOS transistor 68; a feedback path 70 in the latch 54 for the second read port has two PMOS transistors 72 and 74 in series; and a feedback path 76 in the latch 56 for the third read port has three series-connected PMOS transistors 78, 80 and 82.

The first bit line 46 is gated into the first latch 52 by a NMOS reading transistor 84, into the latch 54 by a transistor 86 and into the third latch 56 by a transistor 88. The second bit line 48 is gated into the second latch 54 by a transistor 90 and into the third latch 56 by a transistor 92. The third bit line 50 is gated into the latch 56 by a transistor 94. Thus, the first bit line can be gated into any of three latches while the third bit line 50 can be gated into only one latch. Each of the NMOS reading transistors disposed between a bit line and a latch corresponds to a respective port select means.

The first bit line 46 is connected to a positive potential through a PMOS precharging transistor 96. The second bit line 48 is connected to this positive potential through a series connection of two PMOS precharging transistors 98 and 100. The third bit line is connected to the positive potential through a series connection of three precharging transistors 102, 104 and 106.

The inhibit and transfer circuits are controlled by a series of control signals. A sense clock signal goes high when data is being transferred to the latches 52, 54 and 56. A comparison signal A is high when the address P1 equals the address P3, as determined by the comparator 26. A comparison signal B is high when the address P1 equals the address P2, as determined by the comparator 24. A comparison signal C is high when the address P2 equals the address P3, as determined by the comparator 28. Additional control signals $\overline{A}$, $\overline{B}$ and $\overline{(A+C)}$ are generated by unillustrated inverters and OR gates from the control signals A, B and C.

The sense clock is connected to both inputs of an AND gate 108 in the first inhibit and transfer circuit 30, and its output, buffered by an amplifier 110, controls the gate electrodes of the transistors 96, 84 and 68. In the first inhibit and transfer circuit 30 there is no inhibition since the first bit line 46 is always coupled to the first data output line 40. In the second inhibit and transfer circuit 32, the sense clock signal is combined with the compression signal B in an AND gate 112 and the output is used to control the gate electrodes of the transistors 98, 86 and 72. The sense clock is combined with the complemented comparison signal $\overline{B}$ in an AND gate 114, the output of which is used to control the gate electrodes of transistors 100, 90 and 74. The AND gate 112 indicates that data needs to be transferred from the first bit line 46 to the second data output line 42, when the addresses P1 and P2 are equal, while the AND gate 114 indicates a normal situation where data is transferred from the second bit 48 to the second data output line 42. In the third inhibit and transfer circuit 34, the sense clock signal is combined in an AND gate 116 with the comparison signal A, the output of which controls the gate electrodes of the transistors 102, 88 and 78. The sense clock signal is combined with the comparison signal C and the complemented comparison signal $\overline{A}$ in an AND gate 118, the output of which controls the gate electrodes of the transistors 104, 92 and 80. The additional comparison signal $\overline{A}$ assures that only the AND gate 116 goes active when all three addresses P1, P2 and P3 are equal. Finally, the sense clock signal is combined with the control signal $\overline{A+C}$ in an AND gate 120, the output of which controls the gate electrodes of the transistors 106, 94 and 82. The AND gates 116 and 118 respectively indicate when the first bit line 46 and the second bit line 48 are to be coupled to the data output line 44. On the other hand, the AND gate 120 indicates the normal situation when the third bit line 50 is to be coupled to the third data output line 44.

Before a reading operation begins, the sense clock signal is low. As a result, all of the AND gates 108, 112, 114, 116, 118, and 120 produce a low output. Therefore, the PMOS precharging transistors 96, 98, 100, 102, 104 and 106 are all conductive and the NMOS reading transistors 84-94 are all non-conductive. Also, the PMOS feedback transistors 68, 72, 74, 78, 80 and 82 are all conductive so that the feedback paths 66, 70 and 76 are not interrupted. Thus, the latches 52, 54 and 56 are in their respective state producing valid outputs on the data output lines 40, 42 and 44. Because of the conducting state of the precharging transistors 96-106, all the bit lines 46, 48 and 50 are connected to the positive potential and these bit lines are thus precharged.

At the beginning of a read cycle, the addresses P1, P2 and P2 are delivered to the address decoders 14, 16 and 18 and to the comparators 24, 26 and 28. A word line read clock pulse WLDR then causes the memory cells 12 which have been addressed and not inhibited to discharge selected bit lines 46, 48 and 50 according to the data stored in the memory cells 12. The comparison signals A, B and C also assume the states dependent upon the addresses P1, P2 and P3. The sense clock signal goes high. This transition has three separate effects. First, the bit lines 46, 48 and 50 are separated from the precharging potential. Secondly, each of the feedback paths 66, 70 and 76 are interrupted by at least one of the AND gates 108 and 112–120. Finally, the bit lines 46, 48 and 50 are connected through the reading transistors 84, 86, 88, 90, 92, and 94 to the latches 52, 54 and 56. Which decoder is connected to which bit line is determined by the comparison signals A, B and C although the first latch 52 is always necessarily connected to the first bit line 46. Since the feedback paths 66, 70 and 76 have been interrupted, the dynamic charge on the bit lines 46, 48 and 50, selectively discharged by the memory cells 12, is sufficient to change the state of the latches 52, 54 and 56. Thus, the state of the data output lines 40, 42 and 44 is freshly determined. At the end of the read cycle, the sense clock signal goes low. The feedback paths 66, 70 and 76 are reconnected at the same time that the latches 52, 54 and 56 are disconnected from the bit lines 46, 48 and 50. Thus, fresh data is transferred and latched into the latches 52, 54 and 56 and continues to be output on the data output lines 40, 42 and 44.

Figure 3:
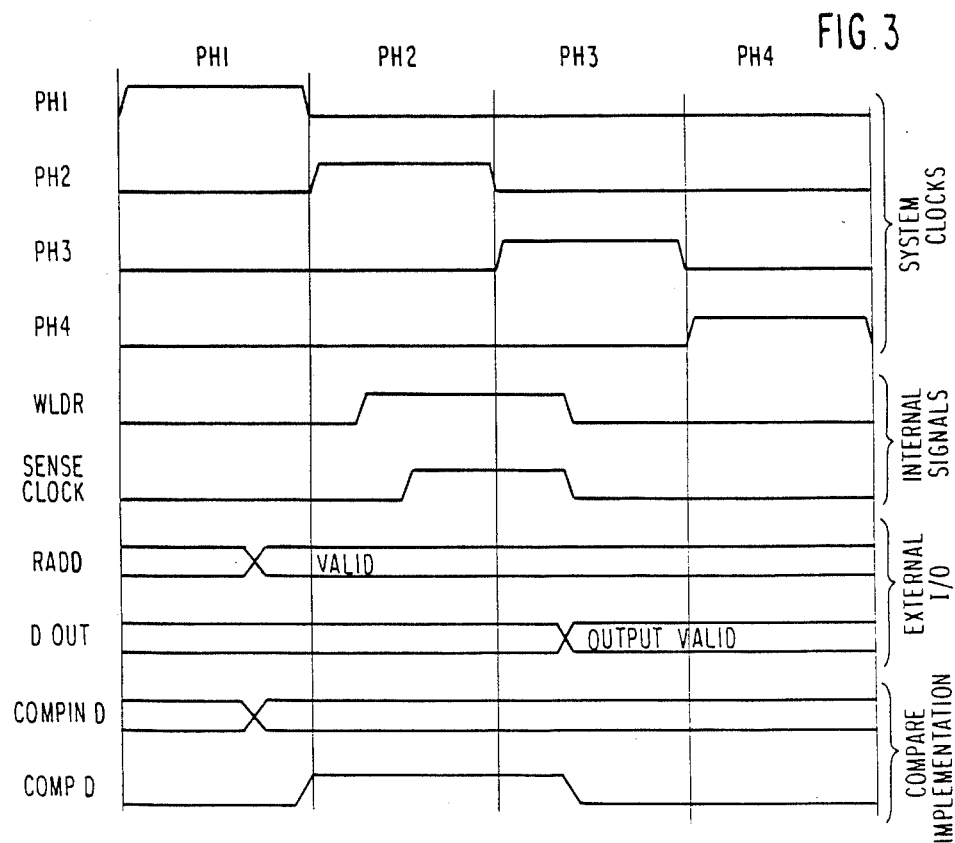
FIG. 3 is a timing diagram illustrating the operation of the circuit of FIG. 2.

A timing diagram for the operation of the circuit of FIG. 2 is presented in FIG. 3. This timing depends upon a four phase clock providing clock signals PH1, PH2, PH3 and PH4. Each clock phase pulse is active when positive and is 25 nanoseconds long. The read address RADD is the combination of the address signals P1, P2 and P3 which are also used for the inputs to the comparators 24, 26 and 28. In the preferred embodiment, the comparators 24, 26 and 28 are off-chip and provide the comparison signals A, B and C (represented by COMPIND) simultaneously with the read address RADD. The COMPIND signals are then internally latched to provide equivalent comparison signals COMPD. The comparison signals on the word lines 20 to the memory cells 12 are represented by the word line read clock signal WLDR. Although the timing diagram shows the word line read clock signal WLDR going active a few nanoseconds before the sense clock, this time is approximately the delay or charging time between the decoders 14, 16 and 18 and the memory cells 12. Therefore, the end of the precharging nearly coincides with the beginning of data discharging of the bit lines. The upward transition of the sense clock begins the operation of the inhibit and transfer circuits and its downward transition establishes the validity of the output signals DOUT and the end of the reading cycle as far as the inhibit and transfer circuits are concerned.

What is claimed is:

1. An electronic inhibit and transfer circuit for allowing an output port of an electronic read circuit to selectively output a memory signal present on a selected one of a plurality of bit lines, said inhibit and transfer circuit comprising:
   a sense latch;
   a respective bit line precharge means, coupled to each bit line for precharging said each bit line;
   a respective port select means disposed between each bit line and said sense latch; and
   clocked control means, responsive to address comparison signals, for applying control pulses to both a bit line precharge means and a port select means which are associated with a selected bit line, said control pulses being applied to said bit line precharge means to stop a precharging operation, and to said port select means to couple the selected bit lines to said sense latch.

2. An inhibit and transfer circuit as recited in claim 1, further comprising latch prevention means responsive to said control pulses for preventing latching in said sense latch.

3. An inhibit and transfer circuit as recited in claim 1, wherein each said bit line precharge means includes a transistor of a first conductivity type coupling a bit line to said voltage precharge potential, and each said port select means includes a transistor of a second conductivity type coupling a bit line to said sense latch.

4. An electronic inhibit and transfer circuit for allowing respective output ports of an electronic read circuit to selectively output a memory signal present on a selected one of a plurality of bit lines, said inhibit and transfer circuit comprising:
   a plurality of sense latches;
   a plurality of bit lines receiving respective memory signals, respective subsets of said plurality N of bit lines being associated with respective sense latches;
   a respective bit line precharge means for connecting each bit line to a voltage precharge potential, each bit line precharge means being responsive to control signals for disconnecting its respective bit line from said voltage precharge potential; and
   a respective port select means disposed between each respective bit line and each respective sense latch with which the bit line is associated, each port select means being responsive to said control signals for selectively connecting said each respective bit line to said each respective sense latch.

5. An inhibit and transfer circuit as recited in claim 4, further comprising:
   latch prevention means responsive to said control signals for preventing latching in said sense latches.

6. An inhibit and transfer circuit as recited in claim 4, further comprising:
   means for providing a plurality of N of addresses; and
   comparing means for comparing said addresses among themselves to produce said control signals.

7. An inhibit and transfer circuit as recited in claim 4, wherein each said bit line precharge means includes a transistor of a first conductivity type coupling a bit line to said voltage precharge potential, and each said port select means includes a transistor of a second conductivity type coupling a bit line to a sense latch.

8. An inhibit and transfer means as recited in claim 4, further comprising:
   clocked control means, responsive to address comparison signals, for producing and applying said control signals to both respective said bit line precharge means and respective said port select means, said control signals being applied to said bit line precharge means to stop a precharging operation, and to said port select means to couple the associated said bit line to said sense latch.

* * * * *